(12) United States Patent
Weiss

(10) Patent No.: US 11,327,128 B2
(45) Date of Patent: May 10, 2022

(54) OPTICAL DETECTION OF A SUBJECT COMMUNICATION REQUEST

(71) Applicant: KONINKLIJKE PHILIPS N.V., Eindhoven (NL)

(72) Inventor: Steffen Weiss, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 17/058,355

(22) PCT Filed: May 23, 2019

(86) PCT No.: PCT/EP2019/063412
§ 371 (c)(1),
(2) Date: Nov. 24, 2020

(87) PCT Pub. No.: WO2019/228912
PCT Pub. Date: Dec. 5, 2019

(65) Prior Publication Data
US 2021/0116519 A1 Apr. 22, 2021

(30) Foreign Application Priority Data

May 28, 2018 (EP) .................................... 18174509

(51) Int. Cl.
*G01R 33/28* (2006.01)
*G01R 33/385* (2006.01)
(Continued)

(52) U.S. Cl.
CPC ......... *G01R 33/283* (2013.01); *G01R 33/288* (2013.01); *G01R 33/385* (2013.01);
(Continued)

(58) Field of Classification Search
CPC .. G01R 33/283; G01R 33/288; G01R 33/385; G01R 33/48; G06V 40/166; G06V 40/20; G10L 15/22; G10L 25/84
See application file for complete search history.

(56) References Cited

U.S. PATENT DOCUMENTS

| | | |
|---|---|---|
| 4,903,703 A | 2/1990 | Igarashi et al. |
| 6,774,929 B1 | 8/2004 | Kopp |
| | (Continued) | |

FOREIGN PATENT DOCUMENTS

| | | |
|---|---|---|
| KR | 20020068235 A | 8/2002 |
| WO | 2014116868 A1 | 7/2014 |
| WO | 2014178491 A1 | 11/2014 |

OTHER PUBLICATIONS

Cutler R, Davis L. Look who's talking: speaker detection using video and audio correlation. Multimedia and Expo, 2000. ICME 2000. 2000 IEEE International Conference on. vol. 3.

(Continued)

*Primary Examiner* — G. M. A Hyder

(57) ABSTRACT

The invention provides for a magnetic resonance imaging system (100, 300, 500). The magnetic resonance imaging system comprises a video system (122, 122', 122") configured for providing video images (146) of a facial region (119) of a subject (118) during acquisition of the magnetic resonance imaging data (144). The magnetic resonance imaging system further comprises a memory (134) for storing machine executable instructions (140) and pulse sequence commands (142). Execution of the machine executable instructions causes a processor (130) to: control (200) the magnetic resonance imaging system with the pulse sequence commands to acquire the magnetic resonance imaging data; receive (202) the video images from the video system during execution of the pulse sequence commands; determine (204) a voice activity state (150) in real time for the video images by inputting the video images into a video-based voice activity detection module, wherein the voice activity state indicates a talking state of the subject or a non-talking state of the subject; and provide (206) a voice activity signal (152) if the voice activity state indicates the talking state.

14 Claims, 8 Drawing Sheets

(51) Int. Cl.
  *G01R 33/48* (2006.01)
  *G10L 15/22* (2006.01)
  *G10L 25/84* (2013.01)
  *G06V 40/16* (2022.01)
(52) U.S. Cl.
  CPC ........... *G01R 33/48* (2013.01); *G06V 40/166* (2022.01); *G10L 15/22* (2013.01); *G10L 25/84* (2013.01)

(56) References Cited

U.S. PATENT DOCUMENTS

| | | | |
|---|---|---|---|
| 8,214,012 B2* | 7/2012 | Zuccolotto | A61B 5/055 600/410 |
| 9,548,048 B1 | 1/2017 | Sohl et al. | |
| 2003/0179888 A1 | 9/2003 | Burnett et al. | |
| 2005/0234068 A1 | 10/2005 | Baldwin | |
| 2005/0283068 A1 | 12/2005 | Zuccolotto et al. | |
| 2011/0230755 A1 | 9/2011 | MacFarlane et al. | |
| 2013/0342350 A1 | 12/2013 | Popescu | |
| 2014/0275970 A1* | 9/2014 | Brown | G01R 33/283 600/413 |
| 2015/0045654 A1 | 2/2015 | Lee et al. | |

OTHER PUBLICATIONS

Ramírez, J.; J. M. Górriz; J. C. Segura (2007). "Voice Activity Detection. Fundamentals and Speech Recognition System Robustness" (PDF). In M. Grimm and K. Kroschel. Robust Speech Recognition and Understanding. pp. 1-22. ISBN 978-3-902613-08-0.

International Search Report and Written Opinion From PCT/EP2019/063412 dated Jul. 9, 2019.

* cited by examiner

OPTICAL DETECTION OF A SUBJECT COMMUNICATION REQUEST

CROSS REFERENCE TO RELATED APPLICATIONS

This application is a U.S. national phase application of International Application No. PCT/EP2018/063412 filed on May 23, 2019, which claims the benefit of EP Application Serial No. 18174509.2 filed on May 28, 2018 and is incorporated herein by reference.

FIELD OF THE INVENTION

The invention relates to magnetic resonance imaging, in particular to communication between an operator of a magnetic resonance imaging system and a subject being imaged in the magnetic resonance imaging system.

BACKGROUND OF THE INVENTION

A large static magnetic field is used by Magnetic Resonance Imaging (MRI) scanners to align the nuclear spins of atoms as part of the procedure for producing images within the body of a subject. This large static magnetic field is referred to as the B0 field or the main magnetic field. Various quantities or properties of the subject can be measured spatially using MRI. However, the acquisition of a magnetic resonance imaging data is not instantaneous. The subject may need to remain as motionless as possible for a number of minutes. To ensure the safety of a subject they are provided with a squeeze bulb or pressure-operated balloon switch that that the subject can squeeze if they need to contact the operator. For example, if the subject is experiencing pain, discomfort, or is panicking because of noise and/or being within a confined space.

United States patent application publication US 2011/0230755 discloses an optically-based rigid-body 6-DOF motion tracking system optimized for prospective (real-time) motion correction in Magnetic Resonance Imaging (MRI) applications using a single camera with an on-board image processor, an IR illuminator and optical fiducial targets affixed to a patient. An angle extraction algorithm operated by the on-board image processor utilizes successive approximation to solve the 3-point pose problem for angles close to the origin to achieve convergence to sub-microradian levels. A motion alarm is enabled by a monitor and GUI application in communication with the motion tracking system. A motion correction is enabled for MR scan images taken while operating the motion tracking system wherein an MRI controller is in communication with the motion tracking system.

The US patent application US2005/0283068 discloses a magnetic resonance imaging system with a predictive noise cancelling system. The predictive noise cancelling system cancels acoustic noise of the gradient system utilizing its repetitive nature. The removal of MRI acoustic noise from the patient microphone enables the technician to hear clear speech from the patient in the presence of very intense MRI magnet presented noise.

SUMMARY OF THE INVENTION

The invention provides for a magnetic resonance imaging system, a computer program product, and a method in the independent claims. Embodiments are given in the dependent claims.

A difficulty with using a squeeze bulb to alert the operator of a magnetic resonance imaging system is that the subject may inadvertently drop the bulb and then panic or beginning to move to try to recover the bulb. Holding onto a squeeze bulb may also be difficult for children or for elderly persons. Embodiments of the invention provide for an alternative to using a squeeze bulb by providing a video system that images a facial region of the subject during the acquisition of magnetic resonance imaging data. The video system provides video images that are input to a video-based voice activity detection module that detects when the subject is speaking. When it is determined that the subject is speaking using the video-based voice activity detection module then a voice activity signal is provided.

In one aspect the invention provides for a magnetic resonance imaging system that is configured for acquiring magnetic resonance imaging data from a subject that is at least partially within an imaging zone. The magnetic resonance imaging system comprises a video system configured for providing video images of a facial region of the subject. This may be during acquisition of the magnetic resonance imaging data or even before it in some cases. The magnetic resonance imaging system further comprises a memory for storing machine-executable instructions and pulse sequence commands. The pulse sequence commands are configured for controlling the magnetic resonance imaging system to acquire the magnetic resonance imaging data according to a magnetic resonance imaging protocol. The pulse sequence commands may for example either be commands or data which may be converted into such commands which enables the processor to control the various components for acquiring the magnetic resonance imaging data.

The magnetic resonance imaging system further comprises a processor for controlling the magnetic resonance imaging system. Execution of the machine-executable instructions causes the processor to control the magnetic resonance imaging system with the pulse sequence commands to acquire the magnetic resonance imaging data. Execution of the machine-executable instructions further causes the processor to receive the video images from the video system during the acquisition of the magnetic resonance imaging data. Execution of the machine-executable instructions further causes the processor to determine a voice activity state in real time for the video images by inputting the video images into a video-based voice activity detection module. The voice activity state indicates a talking state of the subject or a non-talking state of the subject. Execution of the machine-executable instructions further causes the processor to provide a voice activity signal if the voice activity state indicates the talking state.

This embodiment may be beneficial because it may provide for a means of identifying when the subject is experiencing discomfort or has a problem during the execution of the machine-executable instructions to acquire the magnetic resonance imaging data. Typically, subjects are currently given a bulb which they can squeeze in their hand to signal the operator of the magnetic resonance imaging system. This may be a problem for example the subject may lose a grip on the bulb and not be able to regain it. Also the subject may have stress worrying about maintaining a hold on the squeeze bulb. If the subject in the present embodiment has difficulties or is experiencing pain the subject may simply begin to talk and this will provide a voice activity signal which may for example be used to alert the operator.

In some examples there may be a threshold of how many frames are labeled before the voice activity is activated.

In typical video-based voice activity detectors even if they are properly trained they may use short clips, for example half a second in duration or a series of frames such as 25 frames in the case of a 50 frame framerate to determine whether the subject is talking. In some examples a criteria for a particular duration or number of frames may be used to indicate talking. In some cases a certain number of frames or duration before a particular frame is used to decide if a frame should be labeled as being in the talking state or not. References to individual images acquired by the video system may for example be referred to as video images, a frame for a single image or also referred to as frames for multiple video images.

The facial region may for example include a region wherein the mouth is visible. In some examples this may include the teeth and lips of the subject.

In another embodiment the magnetic resonance imaging system comprises a communication system. The communication system may be configured to be activated when the voice activity signal is provided. In some examples the communication system may provide for audio and/or video communication between the subject and the operator.

In one embodiment the communication system is an intercom.

In another embodiment the magnetic resonance imaging system further comprises a subject microphone configured for capturing audio data from the subject. The inclusion of a subject microphone may be beneficial because it may provide a means for the operator to directly speak and communicate with the subject. In other examples the use of the subject microphone may be beneficial because it may provide for a means of training the video-based voice activity detection module for a particular subject. In other examples it may be beneficial because it may be used to make a record of what the subject said during the acquisition of the magnetic resonance imaging data. For example, it may be useful for playing back audio from the subject after the voice activity signal has been provided. This may for example provide an opportunity for an operator to ignore speech by the subject or determine that the system needs to be shut down immediately before even talking or communicating with the subject.

In another embodiment execution of the machine-executable instructions further causes the processor to record preliminary video images of the subject using the video system. The preliminary video images comprise frames. Execution of the machine-executable instructions further cause the processor to record preliminary audio of the subject with the subject microphone simultaneously with recording of the preliminary video images. Execution of the machine-executable instructions further causes the processor to label the frames as talking or non-talking by inputting the preliminary audio into an audio-based voice activity detector module. Execution of the machine-executable instructions further cause the processor to train the video-based voice activity detection module using the frames and the label of each of the frames. In this embodiment the video-based voice activity detection module may be trained by acquiring audio and video from the subject. For example, the video-based voice activity detection module may be trained in advance but the additional training may be used to enhance its ability to detect or not the speech for a particular subject.

In another embodiment the training of the video-based voice activity detection module is performed using deep learning. For example, the video-based voice activity detection module may be a neural network or a so-called convolutional neural network.

In another embodiment the audio-based voice activity detector module is configured for excluding gradient coil noise during labeling the frames as talking or non-talking. For example, the voice activity detector module may use filters or may have training to ignore the clicking and thumping noises that gradient coils may use. For example, in many of the preparatory phases of the first scan when a magnetic resonance imaging protocol is performed are either relatively silent or produce a low noise consisting of short clicks which are typically reproducible for various protocols. The sound of the resonance frequency determination are a few well-defined clicks lasting for approximately five seconds. Such periods may for example be used for gathering the preliminary video images and preliminary audio of the subject for generating the training data. It may therefore be proposed to pre-train and configure the audio-based voice activity detector algorithm to disregard these sounds which may be made by the gradient coil system.

In another embodiment the magnetic resonance imaging system further comprises a prompter configured for presenting questions to the subject. Execution of the machine-executable instructions further cause the processor to present a list of questions to the subject using the prompter during recording of the preliminary video images and the preliminary audio. This may for example be beneficial because it may cause the subject to speak which can be recorded as the preliminary video images and the preliminary audio. This may also have the benefit that various questions, which the operator may ask of the subject will be asked automatically and in addition to providing the training for the video-based voice activity detection module useful information or meta data about the subject is also obtained.

The prompter could for example be a video displayer prompter which produces questions which the subject can read. In other instances, the prompter may be an audio system that may play pre-recorded or synthesized voice which poses the questions to the subject.

In some embodiments the video system may comprise cameras for imaging the subject when the subject is outside of the magnetic resonance imaging system. For example, if there is a subject support which is able to move the subject into the magnet the subject could for example have his or her face imaged before the subject goes into the magnetic resonance imaging system. This may enable the acquisition of the preliminary video images and/or the preliminary audio before the subject is even placed into the magnetic resonance imaging system.

In another embodiment the magnetic resonance imaging system further comprises a subject support configured for supporting at least a portion of the subject in the imaging zone. The subject microphone is incorporated into the subject support. This may be beneficial because it may provide for a convenient means of recording the audio data from the subject.

In another embodiment execution of the machine-executable instructions further causes the processor to continuously record the audio data using the subject microphone during acquisition of the magnetic resonance imaging data. The audio data is synchronized with the video images. Execution of the machine-executable instructions further causes the processor to label the audio data using the voice activity state that was determined using the video-based voice activity detection module. Execution of the machine-executable instructions further causes the processor to play back the audio data labeled with the talking state when a signal from the user interface is received. For example, after talking by the subject is detected using the video system the audio that was recorded when the subject was detected as speaking may then be controllably played back to the operator of the magnetic resonance imaging system. This may help the operator in making a decision whether or not to halt the acquisition of the magnetic resonance data or to perform some other action.

In another embodiment execution of the machine-executable instructions further cause the processor to receive a spoken word list by inputting audio data into a speech recognition module. For example, the audio data that is recorded may be converted into speech and then tokenized or made into a list. Execution of the machine-executable instructions further causes the processor to perform any one of the following: raise a predetermined alert in the user interface of the magnetic resonance imaging system if at least a portion of the spoken word list matches in the predetermined word list. Alternatively, or also including the processor may halt the acquisition of the magnetic resonance imaging data if at least a portion of the spoken word list matches the predetermined word list. This embodiment may be beneficial because the magnetic resonance imaging system may be programmed to take appropriate action if particular words are indicated such as if the subject indicates pain or says a word like burning or other word which may indicate a serious problem during the acquisition of the magnetic resonance imaging data. In this instance the magnetic resonance imaging system may be able to halt itself faster than an operator would be able to.

In another embodiment execution of the machine-executable instructions further causes the processor to provide an indicator on the user interface as the signal. The user interface is configured for opening a communication channel between an operator and the subject.

In another embodiment execution of the machine-executable instructions may further cause the processor to generate an audio tone if the voice activity signal is provided.

In another embodiment the video-based voice activity detection module comprises a convolutional neural network. This may be beneficial because convolutional neural networks excel at recognizing various patterns which may be present in audio and/or video.

In another embodiment the magnetic resonance imaging system comprises a magnet with a bore. The camera system comprises multiple cameras mounted within the bore. This may have the advantage that it is not critical where the subject is placed. If there are a number of different cameras the operator or the system itself can select a camera which provides the best view of the subject's facial region.

It is possible to provide very small and compact cameras. It may be practical to put a large number of cameras within the bore of the magnet.

In another embodiment the magnetic resonance imaging system comprises a head coil. The camera system comprises a coil-mounted camera attached to the head coil. This embodiment may be beneficial because the head coil may be designed to fit the subject in a certain way. In this way the camera can be provided to image the facial region of the subject in an optimal manner. Also, the data bus for the head coil may also be shared with the coil-mounted camera.

In another embodiment the camera system comprises a flange-mounted camera configured for imaging a reflected image of the facial region of the subject. For example, there may be a mirror which is mounted on the magnetic resonance imaging system or even a head coil or other apparatus placed on the subject's head which may be used to direct an image of the subject's facial region into the flange-mounted camera.

In another aspect the invention provides for a method of operating a magnetic resonance imaging system configured for acquiring magnetic resonance imaging data from the subject at least partially within the imaging zone. The magnetic resonance imaging system comprises a video system configured for providing video images of a facial region of the subject during acquisition of the magnetic resonance imaging data. The method comprises controlling the magnetic resonance imaging system with the pulse sequence commands to acquire the magnetic resonance imaging data. The pulse sequence commands are configured for controlling the magnetic resonance imaging system to acquire the magnetic resonance imaging data. The method further comprises receiving the video images from the video system. This is done during acquisition of the magnetic resonance imaging data.

The method further comprises determining a voice activity state in real time for the video images by inputting the video images into a video-based voice activity detection module. The voice activity state indicates a talking state of the subject or a non-talking state of the subject. The method further comprises providing a voice activity signal if the voice activity state indicates the talking state. The advantages of this embodiment have been previously discussed.

In another aspect the invention provides for a computer-program product comprising machine-executable instructions for execution by a processor controlling a magnetic resonance imaging system configured for acquiring magnetic resonance imaging data from the subject at least partially within an imaging zone. Execution of the machine-executable instructions further causes the processor to receive video images from a video system during the acquisition of the magnetic resonance imaging data. Execution of the machine-executable instructions further causes the processor to determine a voice activity state in real time with the video images by inputting the video images into a video-based voice activity detection module.

The voice activity state indicates a talking state of the subject or a non-talking stage of the subject. Execution of the machine-executable instructions further cause the processor to provide a voice activity signal if the voice activity state indicates the talking state. This embodiment may for example be used as a plug-in or add-on software for an existing magnetic resonance imaging system which may add the functionality which has been previously described above. The advantages of this have been previously described.

In another aspect the invention provides for a computer program product comprising machine-executable instructions for execution by a processor controlling a magnetic resonance imaging system configured for acquiring magnetic resonance imaging data from a subject at least partially within an imaging zone. The magnetic resonance imaging system comprises a video system configured for providing the video images of a facial region of the subject during acquisition of the magnetic resonance imaging data. Execution of the machine-executable instructions causes the processor to control the magnetic resonance imaging system with the pulse sequence commands to acquire the magnetic resonance imaging data.

The pulse sequence commands are configured for controlling the magnetic resonance imaging system to acquire the magnetic resonance imaging data. Execution of the machine-executable instructions further cause the processor to receive the video images from the video system during acquisition of the magnetic resonance imaging data. Execution of the machine-executable instructions further causes the processor to determine a voice activity state in real time for the video images by inputting the video images into a video-based voice activity detection module. The voice activity state indicates a talking state of the subject or a non-talking state of the subject. Execution of the machine-executable instructions further cause the processor to provide a voice activity signal if the voice activity state indicates the talking state.

The term 'real time' as used herein indicates that the voice activity state is determined within a predetermined delay of when a particular frame or video image has been acquired. The determination of the talking or non-talking state of the subject will typically be based on data from one or more images, video images or frames. For this reason, although the voice activity state is determined in real time, the determination may be determined for example at discreet time intervals.

In some embodiments the term 'real time' means that the voice activity state is determined within a half second. In other examples the term 'in real time' may indicate that the voice activity state is determined within one second or two seconds.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object-oriented programming language such as Java, Smalltalk, C++ or the like and conventional procedural programming languages, such as the "C" programming language or similar programming languages and compiled into machine executable instructions. In some instances, the computer executable code may be in the form of a high-level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance Imaging (MRI) data is defined herein as being the recorded measurements of radio frequency signals emitted by atomic spins using the antenna of a Magnetic resonance apparatus during a magnetic resonance imaging scan. A Magnetic Resonance image or MR image is defined herein as being the reconstructed two or three-dimensional visualization of anatomic data contained within the magnetic resonance imaging data. This visualization can, for example, be performed using a computer.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
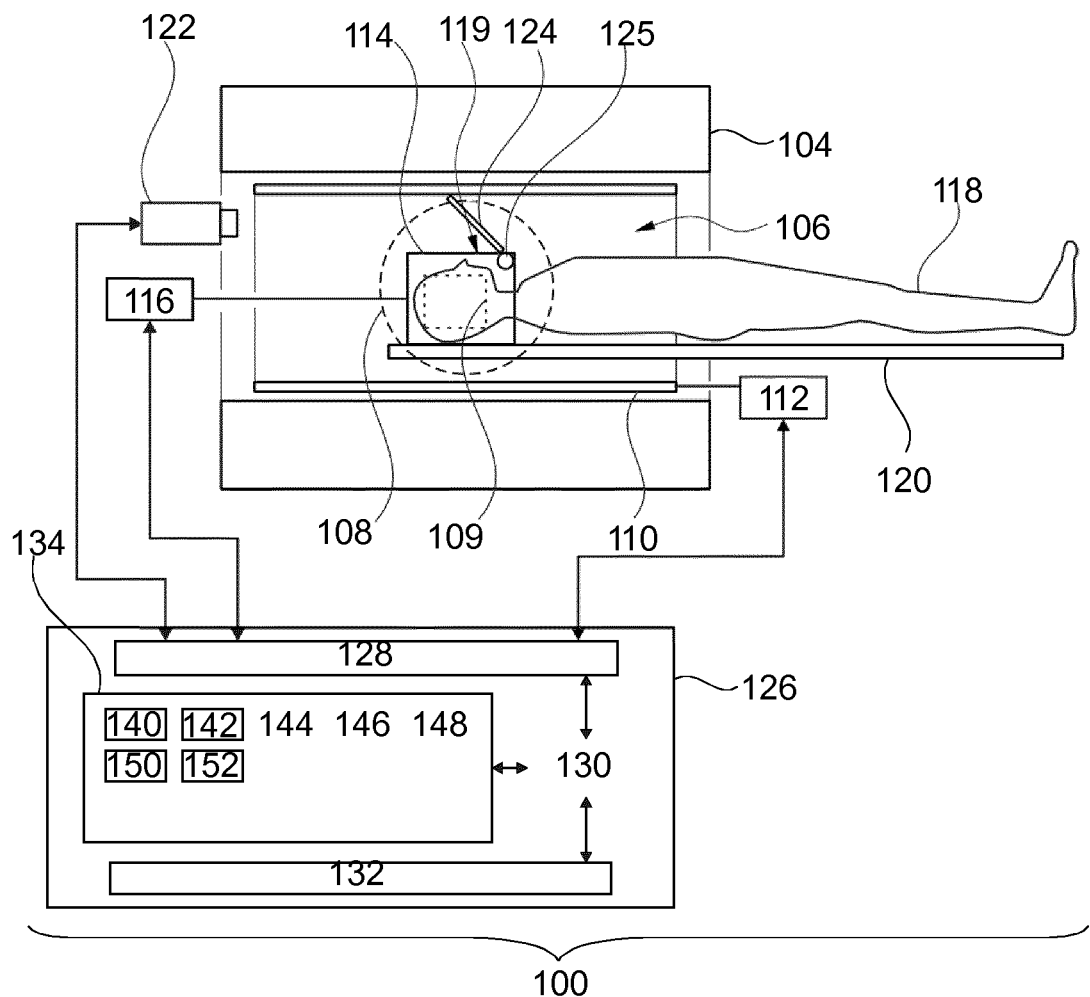
FIG. 1 illustrates an example of a magnetic resonance imaging system.

FIG. 1 shows an example of a magnetic resonance imaging system 100 with a magnet 104. The magnet 104 is a superconducting cylindrical type magnet with a bore 106 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 106 of the cylindrical magnet 104 there is an imaging zone 108 where the magnetic field is strong and uniform enough to perform magnetic resonance imaging. A region of interest 109 is shown within the imaging zone 108. The magnetic resonance data that is acquired typically acquired for the region of interest. A subject 118 is shown as being supported by a subject support 120 such that at least a portion of the subject 118 is within the imaging zone 108 and the region of interest 109.

Within the bore 106 of the magnet there is also a set of magnetic field gradient coils 110 which is used for acquisition of preliminary magnetic resonance data to spatially encode magnetic spins within the imaging zone 108 of the magnet 104. The magnetic field gradient coils 110 connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 for manipulating the orientations of magnetic spins within the imaging zone 108 and for receiving radio transmissions from spins also within the imaging zone 108. A head region of the subject 118 is shown as being within the imaging zone 108. In this example the radio-frequency coil is a head coil 114. The head coil 114 is shown as surrounding the head of the subject 118. There is a region of interest 109 that images a portion of the subject's head region. The head coil 114 is also shown as containing an optional subject microphone 125 for recording audio data from the subject 118. The audio data may for example contain speech spoken by the subject 118. On a flange of the magnet 104 there is a camera system 122. The camera 122 may for example be referred to as a flange-mounted camera. The camera 122 looks into the bore 106 of the magnet.

There is a mirror 124 placed such that a reflection of the subject's 118 facial region is reflected into the camera system 122. The mirror 124 may for example be mounted to or incorporated into the head coil 114 or it may also be attached to the bore 106 of the magnet 104. A mirror may be provided for imaging the facial region 119 even when there is not a head coil 114. For example, the mirror 124 may be incorporated into a headgear or support which is attached to the subject's head in other examples.

The radio frequency coil 114 or antenna may contain multiple coil elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise the transceiver 116 may also represent a separate transmitter and receivers. The radio-frequency coil 114 may also have multiple receive/transmit elements and the radio frequency transceiver 116 may have multiple receive/transmit channels. For example if a parallel imaging technique such as SENSE is performed, the radio-frequency could 114 will have multiple coil elements.

The transceiver 116, the gradient controller 112, and the camera system 122 are shown as being connected to a hardware interface 128 of a computer system 126. The computer system further comprises a processor 130 that is in communication with the hardware system 128, a memory 134, and a user interface 132. The memory 134 may be any combination of memory which is accessible to the processor 130. This may include such things as main memory, cached memory, and also non-volatile memory such as flash RAM, hard drives, or other storage devices. In some examples the memory 134 may be considered to be a non-transitory computer-readable medium.

The memory 134 is shown as containing machine-executable instructions 140. The machine-executable instructions 140 enable the processor 130 to control the operation and function of the magnetic resonance imaging system 100. The machine-executable instructions 140 may also enable the processor 130 to perform various data analysis and calculation functions. The computer memory 134 is further shown as containing pulse sequence commands 142. The pulse sequence commands are configured for controlling the magnetic resonance imaging system 100 to acquire magnetic resonance data from the subject 118 according to a magnetic resonance imaging protocol.

The pulse sequence commands are commands or data which may be converted into such commands which control the various components of the magnetic resonance imaging system 100 to acquire magnetic resonance imaging data 144. The memory 134 is shown as containing magnetic resonance imaging data 144 that has been acquired by controlling the magnetic resonance imaging system 100 with the pulse sequence commands 142. The computer memory 134 is further shown as containing video images 146 that were acquired concurrently with the magnetic resonance imaging data 144. As the video images 146 were acquired they were input into a video-based voice activity detection module 148.

For example, the video images 146 may be input into the module as they are received by the processor. The video-based voice activity detection module 148 then output a voice activity state 150 which may be used to indicate if the subject 118 is in a talking or non-talking state. If the subject 118 is in a talking state then the processor 130 produces a voice activity signal 152. The voice activity signal 152 may be displayed or presented to an operator in different ways. In some instances, an audio signal, a video signal, a visual signal, or a dialogue box on the graphical user interface may be presented. In other instances, the voice activity signal 152 is a trigger which causes additional instructions to be executed by the processor 130.

Figure 2:
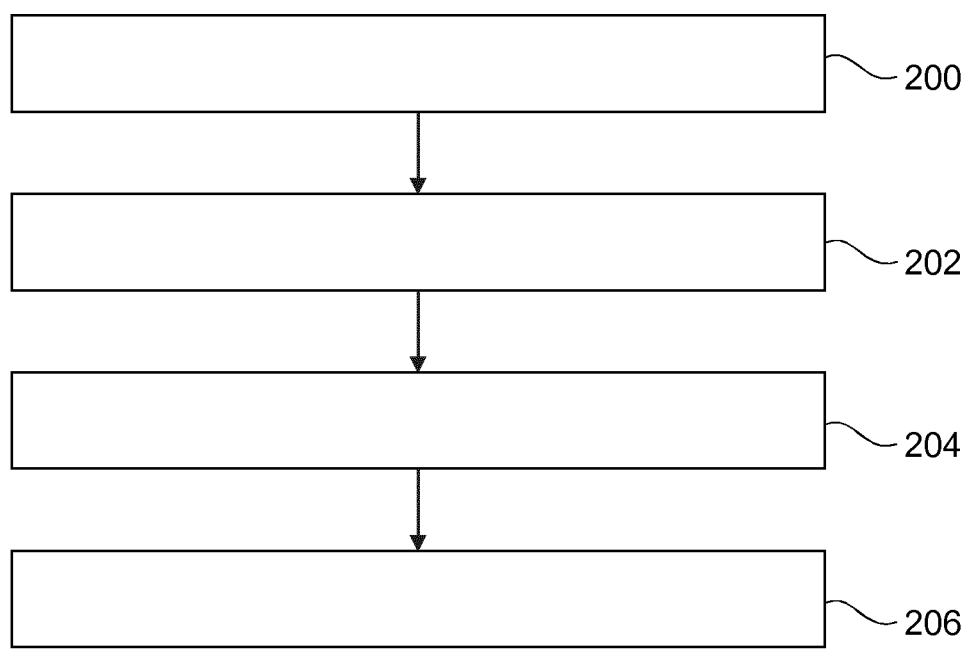
FIG. 2 shows a flow chart which illustrates an example of a method of operating the magnetic resonance imaging system of FIG. 1.

FIG. 2 shows a flowchart which illustrates a method of operating the magnetic resonance imaging system 100. First in step 200 the magnetic resonance imaging system 100 is controlled with the pulse sequence commands 142 to acquire the magnetic resonance imaging data 144. Next in step 202 the video images 146 are received from the camera system 122 at the same time that the pulse sequence commands 142 are being executed. This may also be considered to be when the magnetic resonance imaging data 144 is being acquired. The two are equivalent. Next in step 204 the voice activity state 150 is determined in real time for the video images 146 by inputting the video images 146 into the video-based voice activity detection module 148. Finally, in step 206, the voice activity signal 152 is provided if the voice activity state 150 indicates the talking state of the subject 118.

Figure 3:
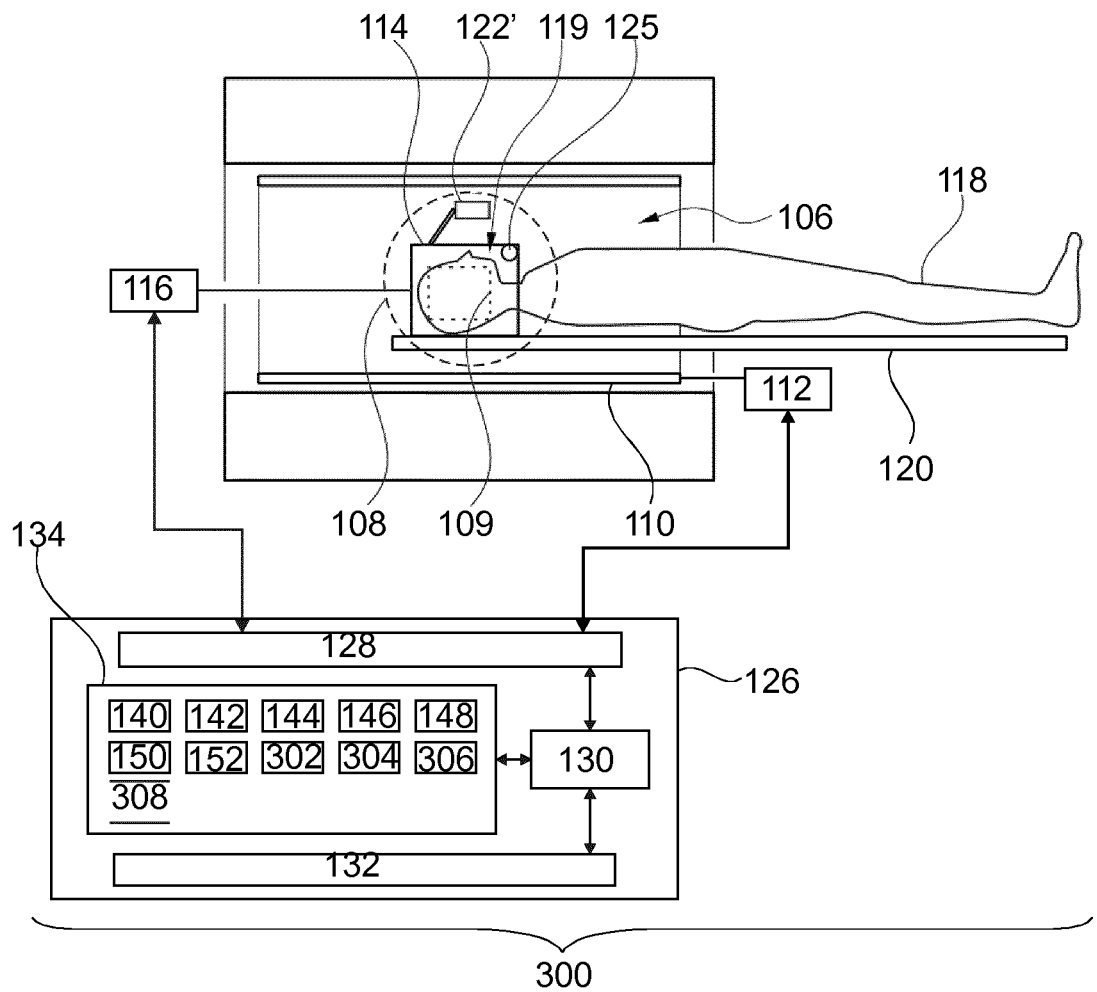
FIG. 3 illustrates a further example of a magnetic resonance imaging system.

FIG. 3 illustrates a further example of a magnetic resonance imaging system 300. The example shown in FIG. 3 is similar to the example shown in FIG. 1 except the camera system 122' has been integrated into the head coil 114. The camera system 122' may for example be mounted such that when the head coil 114 is mounted on the subject's 118 head the camera system 122' is pointed towards the facial region 119.

The memory 134 is further shown as preliminary video images 302 that were acquired. The memory 134 is further shown as containing audio data 304 that was acquired concurrently with the preliminary video images 302. The preliminary video images 302 and the audio data 304 may for example be acquired before the acquisition of the magnetic resonance imaging data or that may be in other examples acquired at the beginning of the magnetic resonance imaging protocol. The memory 134 is further shown as containing labeled preliminary video images 306 that were created by using the audio data 304 as an input into an audio-based voice activity detector module 308. The labeled preliminary video images 306 may for example be used for training the video-based voice activity detection module 148. In some examples the video-based voice activity detection module 148 may be pre-trained and then the labeled preliminary video images 306 are used to adjust the training so that it better responds to speech of the particular subject 118.

Figure 4:
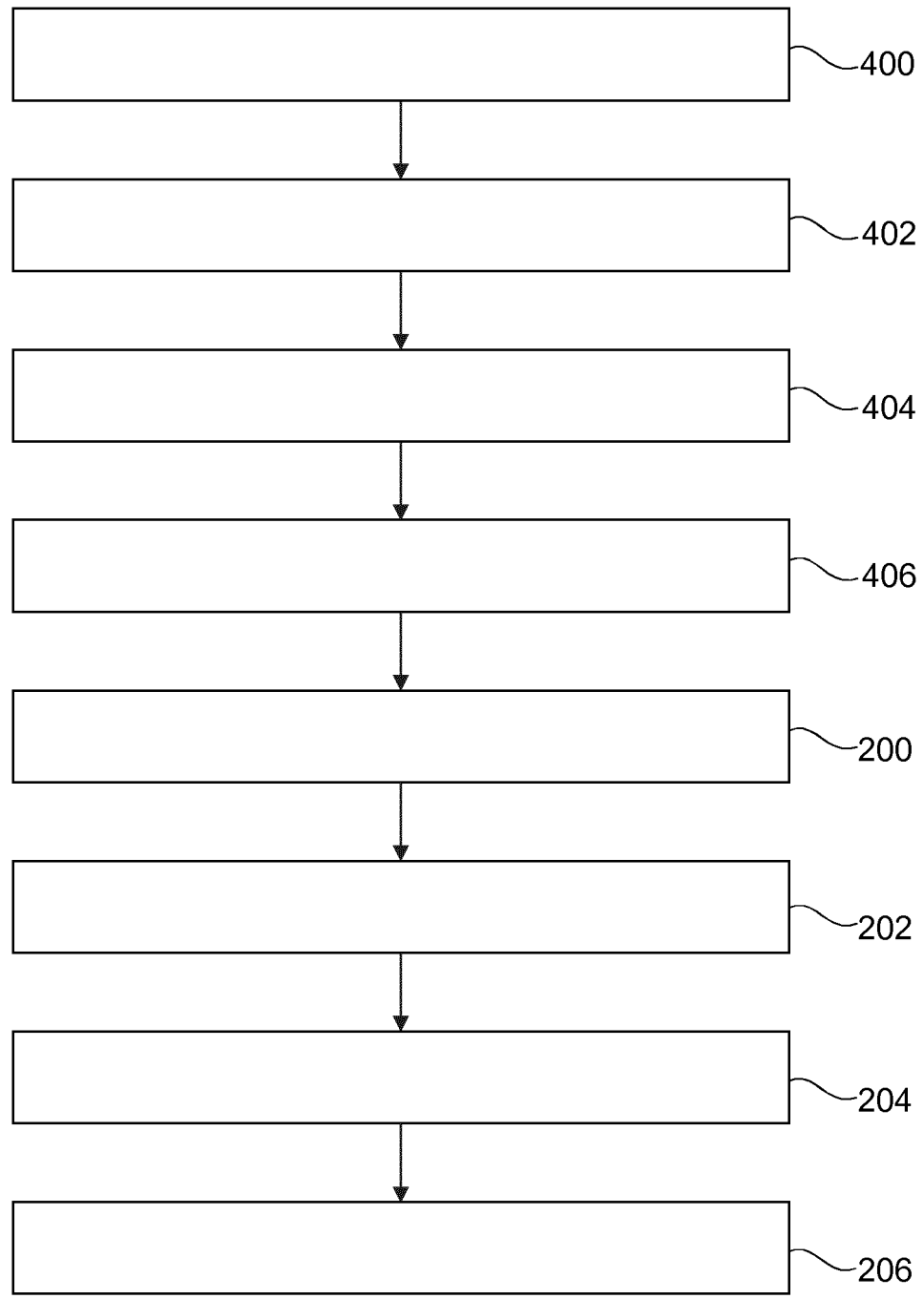
FIG. 4 shows a flow chart which illustrates an example of a method of operating the magnetic resonance imaging system of FIG. 3.

FIG. 4 shows a flowchart which illustrates a method of operating the magnetic resonance imaging system 300 of FIG. 3. The method illustrated in FIG. 4 may also be used to operate the magnetic resonance imaging system 100 of FIG. 1 if the magnetic resonance imaging system 100 also includes the audio-based voice activity detector module 308.

First in step 400 the preliminary video images 302 are recorded. Concurrently with the recording of the preliminary video images 302 step 402 is performed. In step 402 the audio data 306 of the subject 118 is recorded using the subject microphone 125. Next in step 404 the frames of the preliminary video images 302 are labeled by inputting the audio data 304 into the audio-based voice activity detector module 308. The synchronization of the preliminary video images and the audio data 304 enables the creation of a labeled preliminary video images 306. The particular frames arranged as frames are labeled as being talking or non-talking state of the subject 118. These labeled preliminary video images 306 are then used in step 406 where the video-based voice activity detection module 148 is trained using the label of each of the frames.

In some examples the video-based voice activity detection module is a convolution neural network. In this case the training of the video-based voice activity detection module 148 may be accomplished using deep learning.

Figure 5:
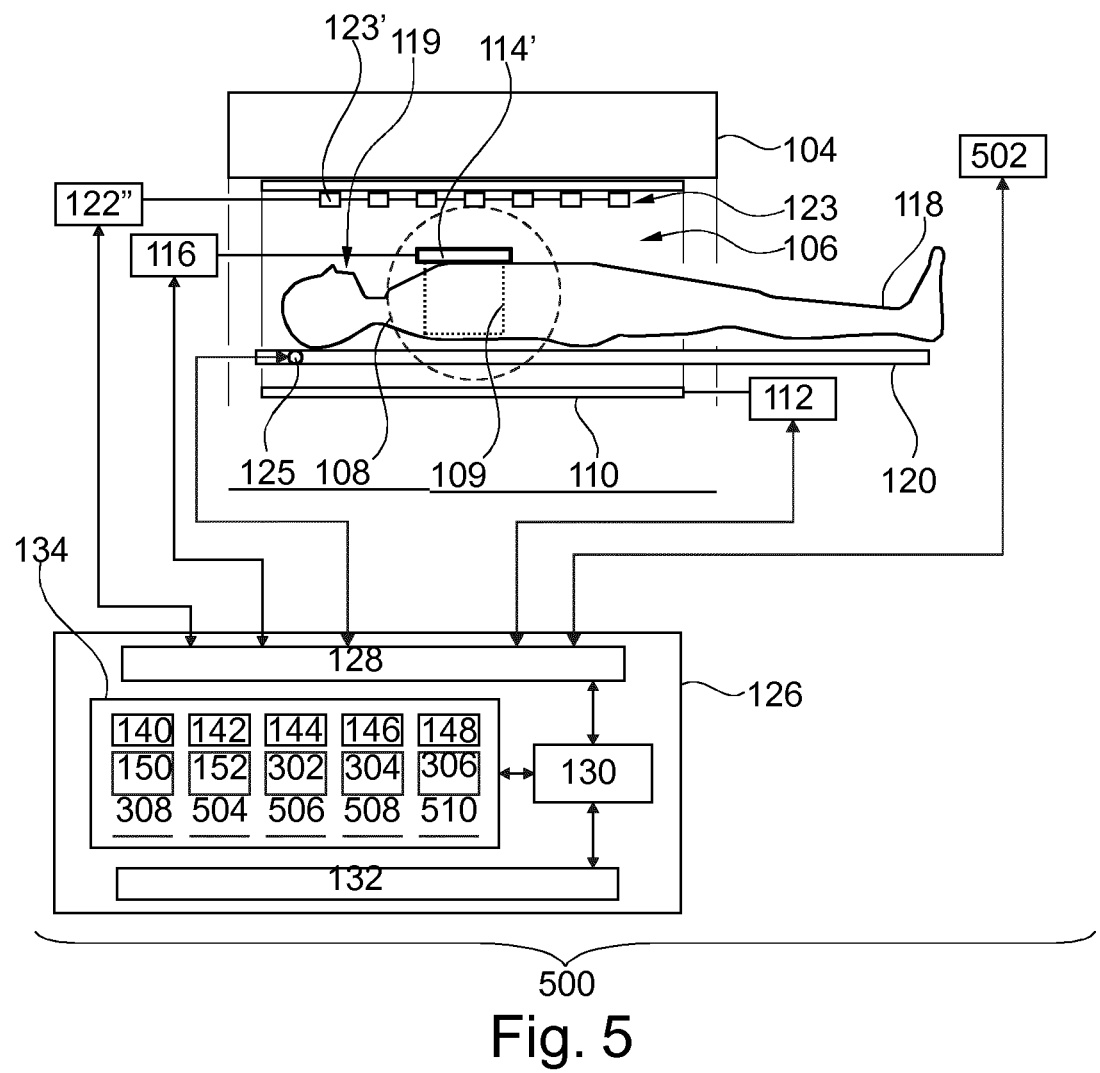
FIG. 5 illustrates a further example of a magnetic resonance imaging system.

FIG. 5 illustrates a further example of a magnetic resonance imaging system 500. The magnetic resonance imaging system 500 depicted in FIG. 5 is similar to the magnetic resonance imaging systems depicted in FIGS. 1 and 3. In this example the video system 122" comprises a number of multiple cameras 123. The multiple cameras 123 are mounted on the inside of the bore 106 of the magnet 104. For example, compact cameras such as used in digital equipment such as cellular telephones enable a large number of compact cameras to be placed in the bore 106. This may enable the positioning of the subject 118 in a relatively arbitrary position. In the examples depicted in FIGS. 1 and 3 the use of the head coil 114 restricted the imaging to the head region of the subject 118. In this example an abdominal region of the subject 118 is being imaged. A radio-frequency coil 114' is placed on the abdomen of the subject 118 and a region of interest 109 below this is imaged. The subject 118 is placed into the bore 106 and then a selected camera 123' from the multiple camera 123 can be selected for acquiring images of the facial region 119 of the subject 118. In this example the optional subject microphone 125 has been incorporated into the subject support 120 in a region which may be near the head of the subject 118. The example shown in FIG. 5 may be convenient because there does not need to be any special appliances or anything placed on the subject 118.

FIG. 5 also depicts an optional prompter 502 which may be used for providing a list of questions 504 to the subject 118. The prompter 502 could for example be a video screen which displays text form of the list of questions 504. If it is a video prompter 502 the prompter may be outside of the bore 106 or even inside. If it is outside of the bore 106 there may be additional cameras for imaging the facial region 118 before the subject goes into the magnet 104. In other examples the prompter 502 may be an audio system for providing the list of questions 504 in an audio form. In any case the prompter 502 produces questions which the subject 118 responds to and is used to produce the preliminary video images 302 and the audio data 306.

The computer memory 134 is also shown as containing a magnetic resonance image 506 that was reconstructed from the magnetic resonance imaging data 144. The magnetic resonance image 506 may also be present in the examples depicted in FIGS. 1 and 3. Likewise the prompter 502 and the list of questions 504 may also be incorporated into the examples illustrated in FIGS. 1 and 3. Additionally the features depicted in FIGS. 1, 3 and 5 may be freely combined as long as they are not mutually exclusive.

FIG. 5 also depicts another optional feature which may be incorporated into the examples shown in FIGS. 1, 3 and 5. The memory 134 is further shown as containing a speech recognition module 508. During the execution of the pulse sequence commands 142 to acquire the magnetic resonance imaging data the audio data 306 can be continuously recorded. This audio data 306 can then be input as it is acquired into a speech recognition module 508. The words as determined by the speech recognition module 508 can then be compared against a predetermined word list 510. For example, words such as 'burn', 'help', 'stop', or other words which may indicate distress or discomfort by the subject 118, can be used to trigger an immediate response by the processor 130. For example, the detection of certain words may cause the magnetic resonance imaging system 500 to automatically cease acquisition of the magnetic resonance imaging data.

Figure 6:
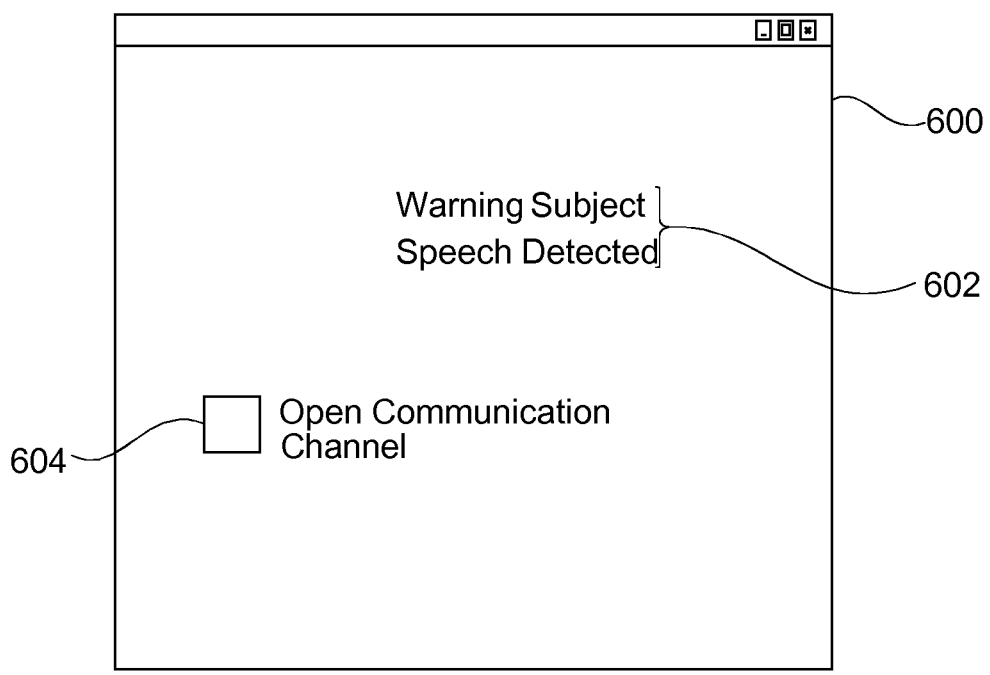
FIG. 6 illustrates an example of a warning dialogue box for a graphical user interface.

FIG. 6 shows an example of a dialogue box 600 which may be opened on a user interface 132 of the computer system 126 in response to the voice activity signal 152. The dialogue box contains a warning 602 that the subject has been detected as speaking. The dialogue box 600 also contains a control 604 which would enable the operator to open a communication channel with the subject 118. For example, this may enable the subject 118 to speak with the operator using a subject microphone 125 such as is depicted in FIGS. 1, 3, and 5 and then there may also be a speaker or audio system which may be used for providing audio from the operator. In other examples the control 604 is a manual control which is not incorporated into the computer system 126.

Figure 7:
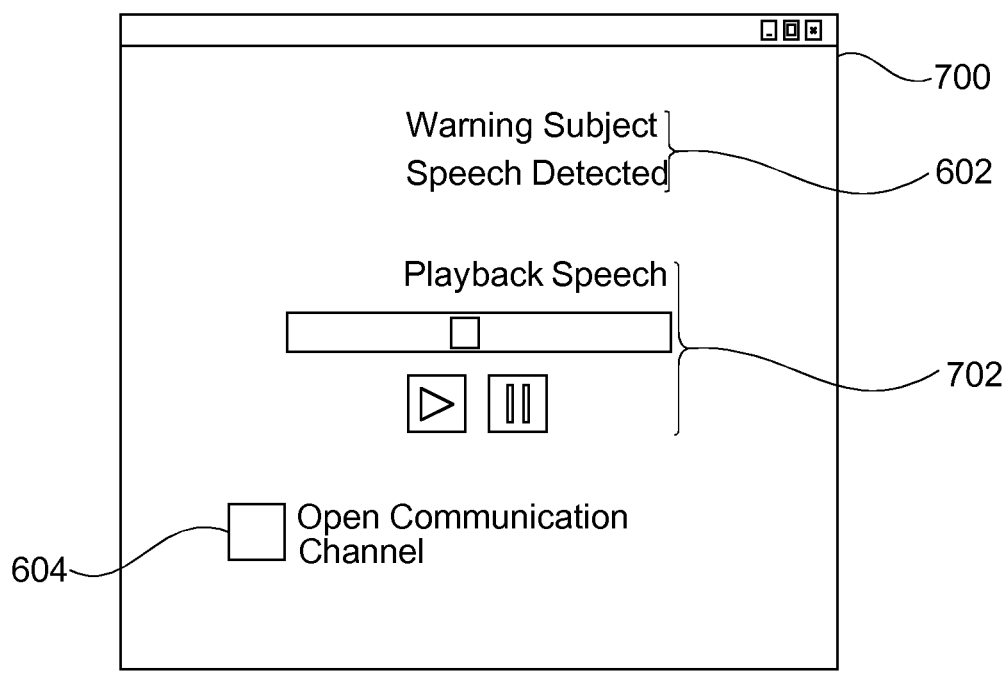
FIG. 7 illustrates a further example of a warning dialogue box for a graphical user interface.

FIG. 7 shows a more complicated example of a dialogue box 700 that can be generated on a user interface in response to the voice activity signal 152. The dialogue box 700 of FIG. 7 contains all of the features of the dialogue box 600 of FIG. 6 with the addition of an audio playback control 702. In this example the audio playback control 702 may be used to play back portions of the audio data 306 that correspond to times when the subject 118 was detected as talking. This for example may enable an operator to see what the subject 118 said when the talking state was detected. For example, if the subject 118 was merely talking with his or herself or said something which was not relevant to the magnetic resonance imaging scan, it may help prevent the operator from stopping the execution of the pulse sequence commands when it is not necessary.

Figure 8:
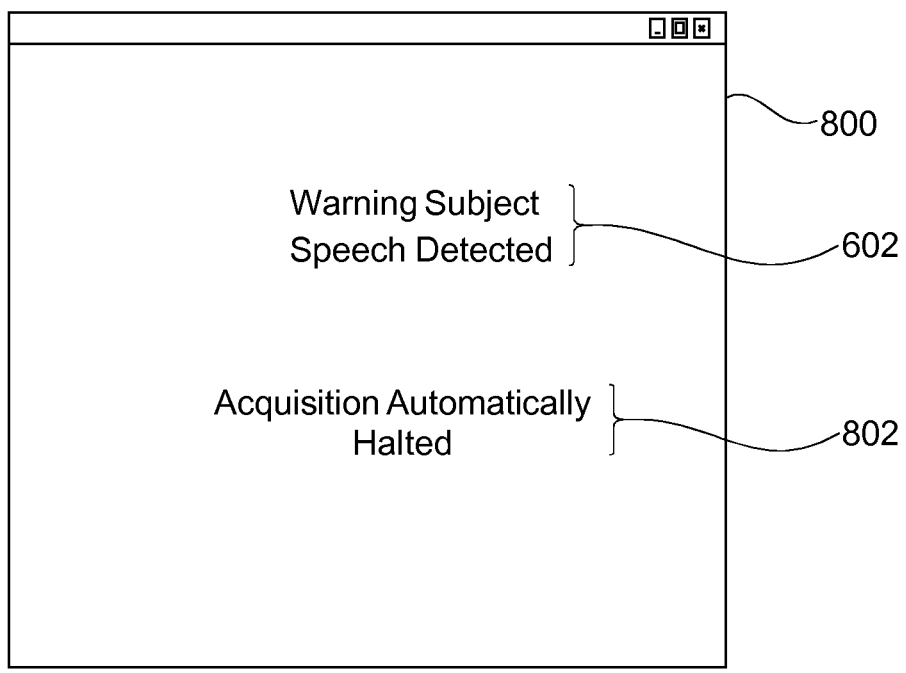
FIG. 8 illustrates a further example of a warning dialogue box for a graphical user interface.

FIG. 8 shows a further example of a dialogue box 800. In this example there is again a warning 602 that subject speech has been detected. However, in this example there is no additional control and there is a notice 802 that the acquisition has been halted. This for example could be a dialogue box 800 that is generated in response to a recognition that words have been spoken by the subject 118 that match words on the predetermined word list 510.

As was mentioned above, currently subject use an old-fashioned pressure-operated balloon switch to announce his wish for communication during scanning, because the patient intercom (communication system) is switched off due to scanner noise.

There is a recent trend for research on using in-bore cameras to detect gross patient motion and physiological motion during scanning Examples may use such cameras to detect mouth motion that is typical for talking, which has been demonstrated for applications as microphone control in audio conferences. This technology may be used to trigger (provide a voice activity signal) the events that are usually triggered by the patient pressing the balloon switch (squeeze bulb), which can therefore be omitted. In consequence, the time to set-up the switch and instruct the patient is saved. The approach also avoids the need for patient understanding and compliance, which is not granted for children, dementia patients, and mentally disabled patients. Also, the patient no longer has to keep the balloon in his hand which is uncomfortable and he may not move to fetch it back if he has lost it.

Examples may overcome one or more of the following disadvantages of the use of a balloon switch. The use of a balloon switch has the following disadvantages:
- The patient has to keep the balloon in his hand during the scan, which can become uncomfortable
- The patient may lose the balloon out of his hand and move at least his hand and arm to get it back, which may introduce motion artefacts.
- The MR operator has to set-up the switch for each patient which takes time.
- The MR operator has to instruct the patient how to use the switch which takes time.
- The patient has to understand and comply with the instructions which may be difficult for some patients as children, dementia patients, mentally dis-abled patients.
- The balloon adds to the bill of materials of the scanner. The software for examples may not.

Some examples may use in-bore cameras to detect mouth motion (facial motion) that is typical for talking. This is used to trigger the events that are usually triggered by the patient pressing the balloon, which can therefore be omitted.

Some of these technologies used to detect talking in video applications may based on neural networks that require training of the algorithm. Some examples may use the typical initial communication of the MR operator with the subject for this training or for adjusting the training to a particular subject.

Examples may generate training data by the integration of an automated patient communication starting when the RF door is closed after positioning the patient and reaching until the silent periods of the preparation phases of the first scan. This communication provokes the subject to speak and uses the respective synchronous video and audio data to train the video analysis. This concept in addition saves time and relieves the operator from routine tasks as asking whether the patient is comfortable and can understand the operator clearly in a time period when the operator is very busy with the preparation of the first scan. Pre-recorded audio clips with the voice of the current MR operator may be used in combination with the possibility of the MR operator to interactively jump in himself to avoid that the patient notes that the conversation is performed by a computer.

This approach may use a video analysis (using the video-based voice activity detector) to decide whether the patient is currently talking or not. Most known solutions to such video analysis are based on neural networks that need to be trained using suitable video data The video analysis may be real-time capable, and the computational time for training must be kept short enough to be performed before the first scan starts. Suitable training data which are labelled whether the patient is talking or not are not readily available. Talking detection algorithms that work without suitable training data are more prone to error. The patient alert mechanism should have a very low false negative rate for safety reasons (case of undetected patient alarm) and a low false positive rate for reason of high scan efficiency (case of false patient alarm).

In one example, cameras and microphones may be integrated into the bore of the MRI magnet. An automated patient-operator/scanner communication is performed during the preparation phase of the first scan and between further scans. This communication provokes the patient to speak and uses the output of synchronous video and audio data to train the video analysis.

In this example, at least one camera is built into the bore of the scanner such that it can see the face of the patient for the most common scan applications and patient positions. A suitable position is at the top of the bore shifted about 20 cm beyond the isocenter to the rear of the magnet, because patients are mostly scanned in supine position with their face at about this position. A second camera is advantageous, also at the top end of the bore but shifted differently along the B0 field axis so that at least one of the cameras sees the face for a range of common positions. A microphone is added with each at least one camera.

Training data for the video analysis may comprise short clips of about 0.5 s duration where the patient is either continuously talking or not. Each clip may be labelled respectively with almost negligible error rate, because this would corrupt training data and result in an elevated error rates of the real-time video analysis as well, which is prohibitive. To generate this robustly labelled training data it is proposed to provoke the patient to talk at times when scanner noise is almost absent. At those times, a relatively simple audio analysis is possible to detect the time periods of talking and robustly. The video data is divided into talking/non-talking clips (talking state/non-talking state) using this information. Voice activity detection (VAD) algorithms are known in speech recognition to detect the periods of talking from audio data. A neural network may be for example trained using these labeled clips.

Training Workflow

A computer-controlled communication may be used to automate a communication with the patient to generate the training data. This saves time and relieves the operator from this task in a time period when he usually is very busy with the preparation of the first scan. This communication may start as soon as the RF door is closed after positioning the patient and at last use the silent periods of the preparation phases of the first scan. This communication is audible for the MR operator so that he can interfere in case of any early patient request or alert. Audio clips with the voice of the respective MR operator himself/herself may be pre-recorded and played during this communication. The MR operator may interactively jump into the communication in case of more complex requests form the patient. This may avoid that the patient notices that he is talking to a machine.

Typical Communication:

1. Scanner (MRI system) asks: "Can you hear me clearly?" The patient may answer and a speech recognition system may analyze the answer to be positive or negative. In case of a negative answer the loudness of the loudspeaker is increased which is announced to the patient. In case of a positive answer the scanner may ask "Is the loudness convenient for you?" This conversation may loop until a convenient loudness is reached.

2. The scanner may ask the patient for his name and age: "I want to make sure that I can understand you clearly. May you therefore please state your full name and your age?"

3. Further questions may be used, asking for the convenience of the patient (position, temperature and similar aspects). A speech recognition system may even evaluate the answers and adapt the temperature.

Known Typical Scanner Noise

Most of the preparation phases of the first scan are either very silent or produce low noise consisting of short clicks which are very reproducible (e.g. resonance frequency determination). Such periods may be used for training data generation as well. It is therefore proposed to train the VAD algorithm to disregard such known noises.

Scanning Workflow

During normal scanning the machine learning-based video analysis is used to detect when the patient starts talking. The loudspeaker of the MR operator is unmuted in this case. The operator may then decide to terminate the scan.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 magnetic resonance imaging system
104 magnet
106 bore of magnet
108 imaging zone
109 region of interest
110 magnetic field gradient coils
112 magnetic field gradient coil power supply
114 head coil
114' radio-frequency coil
116 transceiver
118 subject
119 facial region
120 subject support
122 camera system
122' camera system
122" camera system
123 multiple cameras
123' selected camera
124 mirror
125 subject microphone
126 computer system
128 hardware interface
130 processor
132 user interface
134 computer memory
140 machine executable instructions
142 pulse sequence commands
144 magnetic resonance imaging data
146 video images
148 video-based voice activity detection module
150 voice activity state
152 voice activity signal
200 control the magnetic resonance imaging system with the pulse sequence commands to acquire the magnetic resonance imaging data
202 receive the video images from the video system
204 determine a voice activity state in real time for the video images by inputting the video images into a video-based voice activity detection module
206 provide a voice activity signal if the voice activity state indicates the talking state
300 magnetic resonance imaging system
302 preliminary video images
304 audio data
306 labeled preliminary video images
308 audio-based voice activity detector module
400 record preliminary video images of the subject using the video system
402 record the audio data with the subject microphone simultaneously with recording of the preliminary video images
404 label the frames as talking or non-talking by inputting the audio data into an audio-based voice activity detector module
406 training the video-based voice activity detection module using the frames and the label of each of the frames
500 magnetic resonance imaging system
502 prompter
504 list of questions
506 magnetic resonance image 508 speech recognition module
510 predetermined word list
600 dialogue box
602 warning
604 control to open communication channel
700 dialogue box
702 audio playback control
800 dialogue box
802 notice that acquisition is halted

The invention claimed is:

1. A magnetic resonance imaging system configure to acquire magnetic resonance imaging data from a subject at least partially within an imaging zone, wherein the magnetic resonance imaging system comprises:
   a video system configured to provide video images of a facial region of the subject during acquisition of the magnetic resonance imaging data;
   a memory configured to store machine executable instructions and pulse sequence commands, wherein the pulse sequence commands are configured for controlling the magnetic resonance imaging system to acquire the magnetic resonance imaging data;
   a processor configured to control the magnetic resonance imaging system, wherein execution of the machine executable instructions causes the processor to:
      control the magnetic resonance imaging system with the pulse sequence commands to acquire the magnetic resonance imaging data;
      receive the video images from the video system during execution of the pulse sequence commands;
      determine a voice activity state in real time from the video images by a video-based voice activity detection module having access to the video images, wherein the voice activity state indicates a talking state of the subject or a non-talking state of the subject;
      provide a voice activity signal if the voice activity state indicates the talking state wherein
      execution of the machine executable instructions further causes the processor to provide an indicator on a user interface as the voice activity signal, and
      the user interface is configured for opening a communication channel between an operator and the subject in response to the voice activity signal.

2. The magnetic resonance imaging system of claim 1, wherein the magnetic resonance imaging system further comprises a subject microphone configured for capturing audio data from the subject.

3. The magnetic resonance imaging system of claim 2, wherein execution of the machine executable instructions further causes the processor to:
   record preliminary video images of the subject using the video system, wherein the preliminary video images comprise frames;
   record the audio data with the subject microphone simultaneously with recording of the preliminary video images;
   label the frames as talking or non-talking by inputting the audio data into an audio-based voice activity detector module; and
   training the video-based voice activity detection module using the frames and the label of each of the frames to determine a voice activity state in real time from the video images.

4. The magnetic resonance imaging system of claim 3, wherein the audio-based voice activity detector module is configured for excluding gradient coil noise from said training the video-based voice activity detection module during labeling the frames as talking or non-talking.

5. The magnetic resonance imaging system of claim 3, wherein the magnetic resonance imaging system further comprises a prompter configured for presenting questions to the subject, wherein execution of the machine executable instructions further causes the processor to present a list of questions to the subject using the prompter during recording of the preliminary video images and the preliminary audio.

6. The magnetic resonance imaging system of claim 2, wherein the magnetic resonance imaging system further comprises a subject support configured for supporting at least a portion of the subject in the imaging zone, wherein the subject microphone is incorporated into the subject support.

7. The magnetic resonance imaging system of claim 2, wherein execution of the machine executable instructions further causes the processor to:
   continuously record the audio data using the subject microphone during acquisition of the magnetic resonance imaging data, wherein the audio data is synchronized with the video images;
   label the audio data using the voice activity state; and
   play back the audio data labeled with the talking state when a signal from a user interface is received.

8. The magnetic resonance imaging system of claim 2, wherein execution of the machine executable instructions further causes the processor to:
   receive a spoken word list by inputting the audio data into a speech recognition module;
   perform any one of the following: raise predetermined alerts in a user interface of the magnetic resonance imaging system if at least a portion of the spoken word list matches a predetermined word list, halt the acquisition of magnetic resonance imaging data if at least a portion of the spoken word list matches the predetermined word list, and combinations thereof.

9. The magnetic resonance imaging system of claim 1, wherein the video-based voice activity detection module comprises a convolutional neural network.

10. The magnetic resonance imaging system of claim 1, wherein the magnetic resonance imaging system comprises a magnet with a bore, wherein the camera system comprises multiple cameras mounted within the bore.

11. The magnetic resonance imaging system of claim 1, wherein the magnetic resonance imaging system comprises a head coil, wherein the camera system comprises a coil-mounted camera attached to the head coil.

12. The magnetic resonance imaging system of claim 1, wherein the camera system comprises a flange mounted camera configured for imaging a reflected image of the facial region of the subject.

13. A method of operating a magnetic resonance imaging system configured for acquiring magnetic resonance imaging data from a subject at least partially within an imaging zone, wherein the magnetic resonance imaging system comprises a video system configured for providing video images of a facial region of the subject during acquisition of the magnetic resonance imaging data, wherein the method comprises:
   controlling the magnetic resonance imaging system with pulse sequence commands to acquire the magnetic resonance imaging data, wherein the pulse sequence commands are configured for controlling the magnetic resonance imaging system to acquire the magnetic resonance imaging data;

receiving the video images from the video system during execution of the pulse sequence commands;

determining a voice activity state in real time for the video images by inputting the video images into a video-based voice activity detection module, wherein the voice activity state indicates a talking state of the subject or a non-talking state of the subject; and providing a voice activity signal if the voice activity state indicates the talking state wherein
- an indicator on a user interface is provided as the voice activity signal, and
- the user interface is configured for opening a communication channel between an operator and the subject in response to the voice activity signal.

14. A computer program product comprising machine executable instructions for execution by a processor controlling a magnetic resonance imaging system configured for acquiring magnetic resonance imaging data from a subject at least partially within an imaging zone, wherein execution of the machine executable instructions causes the processor to:

receive video images from a video system during the acquisition (200) of the magnetic resonance imaging data;

determine a voice activity state in real time for the video images by inputting the video images into a video-based voice activity detection module wherein the voice activity state indicates a talking state of the subject or a non-talking state of the subject; and provide a voice activity signal if the voice activity state indicates the talking state and
- provide an indicator on a user interface as the voice activity signal, and
- opening a communication channel between an operator and the subject in response to the voice activity signal.

* * * * *